United States Patent [19]

Ayasli

[11] Patent Number: 4,992,764
[45] Date of Patent: Feb. 12, 1991

[54] HIGH-POWER FET CIRCUIT

[75] Inventor: Yalcin Ayasli, Lexington, Mass.

[73] Assignee: Hittite Microwave Corporation, Woburn, Mass.

[21] Appl. No.: 313,012

[22] Filed: Feb. 21, 1989

[51] Int. Cl.$^5$ ............................................. H01P 5/00
[52] U.S. Cl. .................................... 333/247; 357/22
[58] Field of Search .............. 357/4, 22 I, 22 J, 22 K; 333/247

[56] References Cited

U.S. PATENT DOCUMENTS 4,624,004 11/1986 Calviello .......................... 357/22 K
4,673,958 6/1987 Bayraktaroglu ................ 333/247 X Primary Examiner—Paul Gensler
Attorney, Agent, or Firm—Joseph S. Iandiorio; Brian M. Dingman

[57] ABSTRACT

A power FET includes a substrate of semi-insulating material having a top side and a ground side; an FET fabricated on the ground side of the substrate; and conductor means in the substrate extending from the drain electrode and the gate electrode on the ground side to the top side of the substrate. A ground plane on the ground side of the substrate contacts the source electrode of the FET and is spaced from the gate and drain electrodes to form a dome for minimizing ground inductance and maximizing heat transfer from the FET independent of the thickness of the substrate.

6 Claims, 2 Drawing Sheets

HIGH-POWER FET CIRCUIT

FIELD OF INVENTION

This invention relates to an improved construction for a high-power field effect transistor (FET), and more particularly to an improved construction for FET fabrication in a monolithic microwave integrated circuit.

BACKGROUND OF INVENTION

In present high-power monolithic microwave integrated circuits (MMIC), the heat generated causes increased reliability problems and lower performance. One approach to these problems is to reduce the thickness of the substrate to improve heat conduction away from the MMIC. But typically the substrate is a large wafer, e.g. three inches in diameter, and with reduction in thickness quickly becomes marginally thin and fragile. In addition, the reduction in thickness reduces the impedance of the substrate relative to the RF transmission lines on the substrate and interferes with the microwave transmission line impedance matching design considerations.

A second problem relates to the ground inductance created when "vias" or other conductors are used to connect the source electrode on one side of the substrate to the ground plane on the other side. This causes series feedback, resulting in instability and degradation of RF performance. In addition, with the FET on the opposite side of the substrate from ground, there is a significant thermal resistance which can result in the FET operating at as much as 100° C. above the temperature of the heat sink. One attempt to avoid these problems in discrete FETs used a "flip chip" approach in which the discrete FET was flipped upside down and the drain, source and gate were connected to terminals on the top of raised pedestals. This introduced another set of problems because the connection to the pedestals had to be done blindly, which resulted in misregistration and collection of unseen debris in the pedestal area, which deleteriously affected the performance of the FET. For these reasons this approach never won wide acceptance. Further, since it was not applicable to complex integrated circuits it could not be used to address the problem in the integrated circuit technology.

SUMMARY OF INVENTION

It is therefore an object of this invention to provide an improved construction for a high-power FET.

It is a further object of this invention to provide such an improved construction for a monolithic microwave integrated circuit (MMIC).

It is a further object of this invention to provide such an improved MMIC adapted for RF signal processing.

It is a further object of this invention to provide such an improved construction which ensures better heat transfer from the FET and enhanced reliability and performance.

It is a further object of this invention to provide such a construction in which the heat transfer characteristics and the RF impedance of the MMIC are decoupled so that the heat transfer function of the substrate can be varied without affecting its RF impedance characteristics.

It is a further object of this invention to provide such a construction in which the FET ground inductance link which gives rise to series feedback and the resulting instability and degradation of RF performance are eliminated.

It is a further object of this invention to provide such a construction in which the thermal resistance between the FET and the heat sink underlying the substrate is dramatically reduced without affecting the RF impedance.

The invention results from the realization that a truly simple and effective FET can be fabricated with high heat transfer characteristics while maintaining essential RF impedance characteristics by fabricating the FET on the ground surface of the substrate and covering it with a ground plane which contacts the source electrode but is spaced over the drain and gate electrodes to form a dome.

This invention features a high-power FET including a substrate of semi-insulating material having a top side and a ground side. An FET is fabricated on the ground side of the substrate. There are conductor means in the substrate extending from the drain electrode and the gate electrode on the ground side to the top side of the substrate. A ground plane on the ground side of the substrate contacts the source electrode of the FET and is spaced from the gate and drain electrodes to form a dome for minimizing ground inductance and maximizing heat transfer of the FET independent of the thickness of the substrate.

The invention also features a microwave monolithic integrated high-power FET circuit including a substrate of semi-insulating material having a top side and a ground side. There is a passive RF circuit on the top side and an FET fabricated on the ground side of the substrate. Connector means in the substrate extend from the drain electrode and the gate electrode on the ground side to the top side of the substrate. A ground plane on the ground side of the substrate contacts the source electrode of the FET and is spaced from the gate drain electrode to form a dome over them for minimizing ground inductance and maximizing heat transfer of the FET independent of the thickness of the substrate and decoupled from the RF circuit impedance matching constraints.

DISCLOSURE OF PREFERRED EMBODIMENT

Other objects, features and advantages will occur to those skilled in the art from the following description of a preferred embodiment and the accompanying drawings, in which.

The invention may be accomplished by fabricating an FET on the ground side instead of the top side of a substrate of semi-insulating material. The gate and drain electrodes, as well as the source electrode, which may be formed in two parts, are fabricated on the ground side of the substrate on a small area of semiconducting gallium arsenide embedded in the main portion of the substrate, which is formed of semi-insulating gallium arsenide. A ground plane, such as a metal coating, is formed along the ground side of the substrate covering all or most of the source electrode and forming a dome over the gate and drain electrodes, which separates and insulates them from contact with the ground plane. The space between may be filled with air or some other insulating substance. A conductor, such as a via, extends from the drain and from the gate upward to the top side of the substrate.

When this construction is used for a monolithic microwave integrated circuit, the RF circuitry remains on the top side of the substrate as usual. The substrate is mounted in the usual fashion with its ground side on a heat sink.

With this construction, the additional heat generated by the high-power FET can be conducted away so that there is little or no decrease in reliability and lowering of performance. This is so because the FET is now on the side of the substrate which is in contact with the heat sink the heat need not travel from the top side through the entire thickness of the substrate top the heat sink as was the case in the previous mode of construction. Since the FET is on the ground surface adjacent the heat sink there is also no requirement to adjust the thickness of the substrate in order to establish the proper heat transfer from the FET to the substrate. Thus the thickness of the substrate can be controlled wholly by the requirement to match the impedance of the RF transmission line. In this way the heat transfer constraint conventionally applied to substrate thickness is removed, and the heat transfer and RF impedance matching goals may be decoupled. In addition, with the source electrode on the ground side of the substrate there is no ground inductance such as was created when the source was on the top side and a via or similar conductor was used to connect the source electrode through the entire substrate to the ground plane on the ground side of the substrate. With the elimination of the ground inductance the problems with series feedback and resulting instability and degradation of RF performance are eliminated. Thus thermal resistance of the device is minimized, source lead inductance is minimized, the heat transfer characteristics and RF impedance characteristics are decoupled, making for easier design, and the total area available for passive circuit design on the top side is increased.

Figure 1:
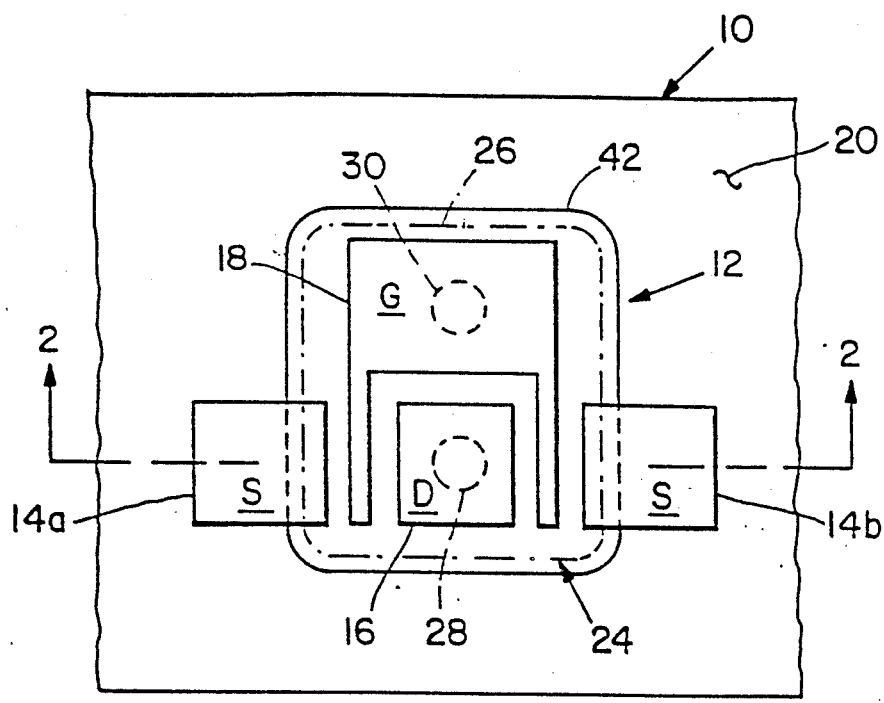
FIG. 1 is a bottom plan view of an FET fabricated on a portion of a substrate according to this invention showing the dome with the rest of the ground plane and heat sink removed for cleaning.

There is shown in FIG. 1 a portion of a substrate 10 with an FET 12 fabricated on it. The FET includes a source electrode shown in two parts, 14a and 14b, a drain electrode 16 and a gate electrode 18. The entire FET 12 is fabricated on the ground side 20 of the substrate and covered by the ground plane 22, which covers the entire ground side 20 up to and including the source electrode 14a and 14b, leaving an open area around drain electrode 16 and gate electrode 18 where the ground plane conductor 22 forms a dome 24 indicated by the faint dashed line 26. A via or similar conductor 28 rises from the drain electrode 16 through semiconductor 42 in the opposite direction from the ground side, up through the substrate to the top side 32. A similar via or conductor 30 extends from gate electrode 18.

Figure 2:
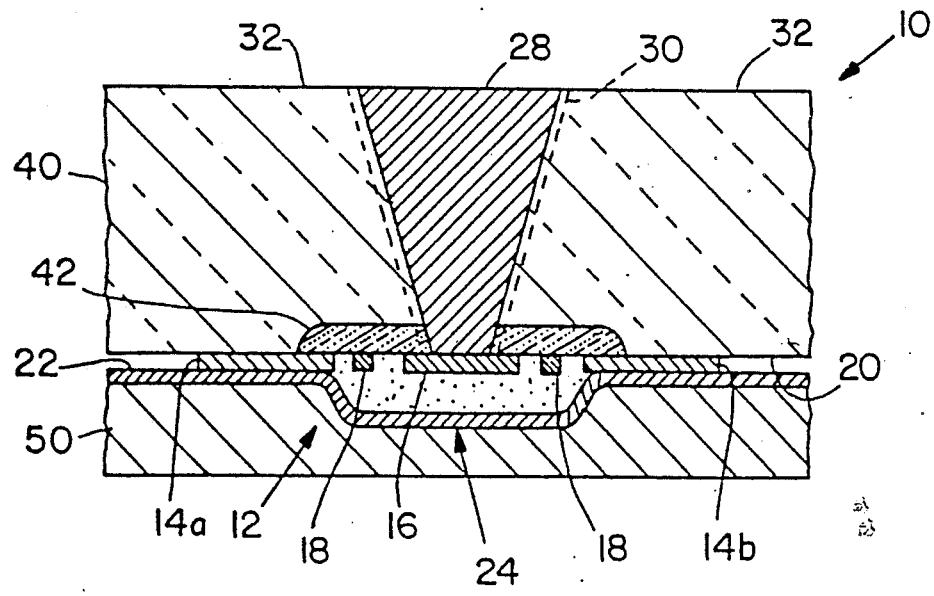
FIG. 2 is a cross-sectional view taken along lines 2—2 of FIG. 1.

The vias 28 and 30 are shown in more detail in FIG. 2, where it can be seen that they have a generally conical shape and extend from the upper surface of the drain electrode 16 and gate electrode 18 to the top side 32 of substrate 10. The main portion 40 of substrate 10 is formed of a semi-insulating gallium arsenide material. The portion 42 directly beneath FET 12 is formed of semiconducting gallium arsenide. The ground plane conductor 22, as well as the vias 28 and 30, are formed of a conductor material, normally metal and frequently gold. The entire substrate 10 is mounted on a heat sink 50 adjacent the ground plane conductor 22.

Figure 3:
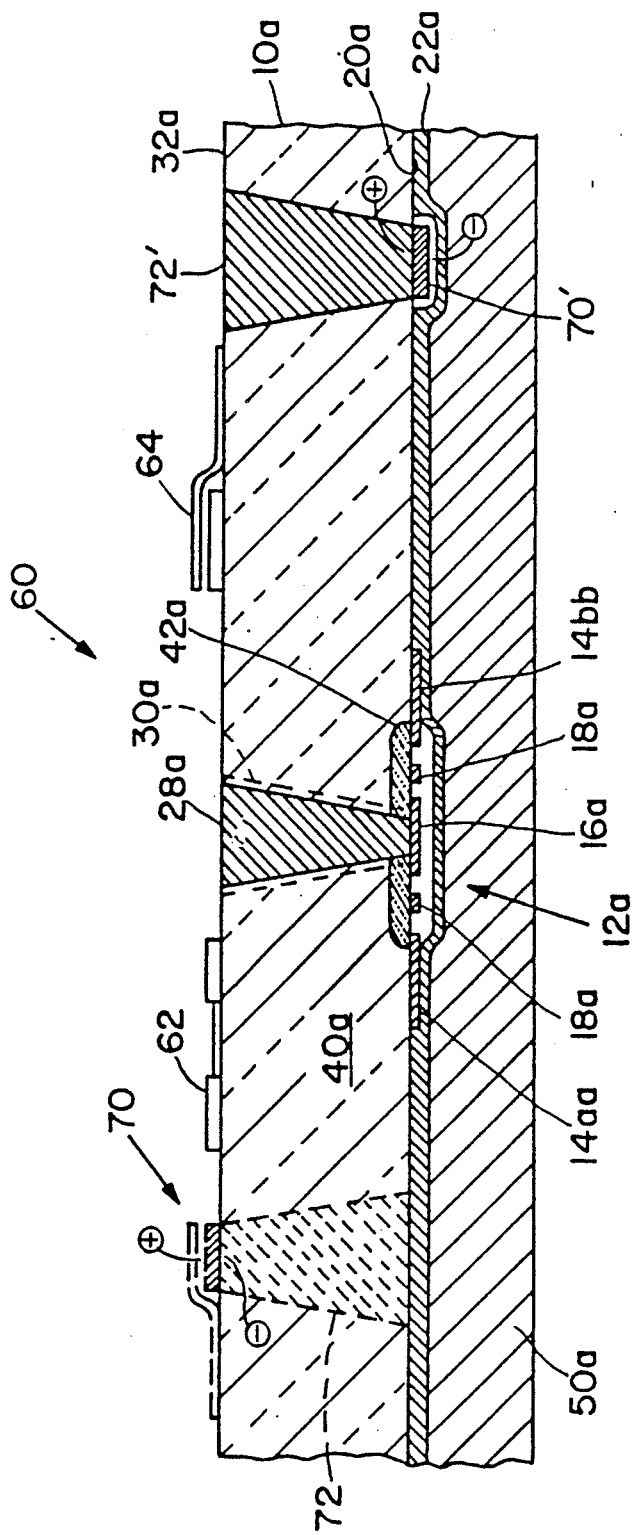
FIG. 3 is a cross-sectional view similar to FIG. 2 of an FET fabricated on a substrate with a portion of an RF circuit according to this invention.

In one construction, FET 12a, FIG. 3, forms a part of a larger monolithic microwave integrated circuit 60 on substrate 10a. The RF components 62, 64 may be mounted on the top side 32a of substrate 10a with the thickness of substrate 10a set to satisfy the RF circuit impedance matching constraints independent or any heat transfer requirements for FET 12a since FET 12a is now on the ground side 20a of substrate 10a, where it is directly serviced by heat sink 50a. With the source electrode already on the ground side of substrate 10a there is no need for a via connection from the source on the top side to the ground side of the substrate as previously required, which would introduce the deleterious effects of ground inductance.

With this construction other components, such as capacitor 70, shown in phantom, may be also moved from the top side 32a to the ground side 20a as indicated at 70', with its accompanying via 72 inverted as shown at 72'.

Although specific features of the invention are shown in some drawings and not others, this is for convenience only as each feature may be combined with any or all of the other features in accordance with the invention.

Other embodiments will occur to those skilled in the art and are with the following claims:

What is claimed is:
1. An FET circuit comprising:
   a substrate of semi-insulating material having a top side and a ground side;
   an FET including a drain electrode, a gate electrode and a source electrode fabricated on the ground side of said substrate;
   conductor means in said substrate extending from said drain electrode and said gate electrode on said ground side to the top side of said substrate; and
   a ground plane on the ground side of said substrate contacting the source electrode of said FET and spaced from said gate and drain electrodes to form a dome for minimizing ground inductance and maximizing heat transfer from the FET independent of the thickness of the substrate.

2. The FET circuit of claim 1 in which said dome contains air.

3. The FET circuit of claim 1 in which said dome contains an electrically insulating material.

4. A monolithic microwave integrated FET circuit comprising:
   a substrate of semi-insulating material having a top side and a ground side;
   a passive RF circuit on said top side;
   an FET including a drain electrode, a gate electrode and source electrode fabricated on the ground side of said substrate;
   conductor means in said substrate extending from said drain electrode and said gate electrode on said ground side to the top side of said substrate; and
   a ground plane on the ground side of said substrate contacting the source electrode of said FET and spaced from said gate and drain electrodes to form a dome for minimizing ground inductance and maximizing heat transfer from the FET independent of the thickness of the substrate and decoupled from said RF circuit impedance matching constraints.

5. A method of fabricating an FET circuit comprising:
   fabricating an FET including a drain electrode, a gate electrode and source electrode on the ground side of a substrate;
   constructing a conductive path from the drain and gate electrodes of the FET to the top side of the substrate; and
   establishing a ground plane on the ground side of the substrate with the ground plane contacting the source electrode and forming a dome over the drain and gate electrodes which electrically insulates them from the ground plane.

6. The method of claim 5 in which said dome is filled with an electrically insulating material.

* * * * *